(12) United States Patent
Usui

(10) Patent No.: US 8,188,953 B2
(45) Date of Patent: May 29, 2012

(54) SEMICONDUCTOR DEVICE

(75) Inventor: Hirotoshi Usui, Kyoto (JP)

(73) Assignee: Rohm Co., Ltd. (JP)

( * ) Notice: Subject to any disclaimer, the term of this patent is extended or adjusted under 35 U.S.C. 154(b) by 1178 days.

(21) Appl. No.: 11/945,491

(22) Filed: Nov. 27, 2007

(65) Prior Publication Data

US 2008/0129363 A1    Jun. 5, 2008

(30) Foreign Application Priority Data

Nov. 30, 2006  (JP) ................................. 2006-324871

(51) Int. Cl.
*G09G 3/36*  (2006.01)

(52) U.S. Cl. ........................................................ 345/87

(58) Field of Classification Search .............. 345/87–90, 345/98, 99, 103, 104
See application file for complete search history.

(56) References Cited

U.S. PATENT DOCUMENTS

| | | | |
|---|---|---|---|
| 6,235,997 B1 | 5/2001 | Asada et al. | |
| 6,411,359 B1 * | 6/2002 | Kobayashi et al. | 349/149 |
| 6,529,181 B2 * | 3/2003 | Nakano et al. | 345/98 |
| 6,750,926 B2 * | 6/2004 | Ohgiichi et al. | 349/40 |
| 2004/0150603 A1 * | 8/2004 | Imajo et al. | 345/98 |
| 2007/0052651 A1 * | 3/2007 | Kim et al. | 345/98 |
| 2009/0127692 A1 * | 5/2009 | Kawate et al. | 257/692 |

FOREIGN PATENT DOCUMENTS

| | | |
|---|---|---|
| JP | 63-90865 U | 6/1988 |
| JP | 6-104936 | 4/1994 |
| JP | 2000-59443 | 2/2000 |
| JP | 2000-349192 A | 12/2000 |
| JP | 2004-117944 A | 4/2004 |
| JP | 2006-49695 | 2/2006 |

OTHER PUBLICATIONS

Notification of Reason(s) for Refusal for Japanese Application No. 2006-324871 with English translation dispatched on Feb. 1, 2011.
Chinese Office Action for Application No. 200710196233.3, issued Aug. 24, 2011, with English translation.
Decision of Refusal for U.S. Patent Appl. No. 2006-324871, dispatched Jan. 31, 2012, with English translation.

* cited by examiner

*Primary Examiner* — Richard Hjerpe
*Assistant Examiner* — Jeffrey A Parker
(74) *Attorney, Agent, or Firm* — Cantor Colburn LLP

(57) ABSTRACT

A semiconductor device receives differential input signals, performs predetermined signal processing, and outputs differential output signals. Plural rear surface electrodes, disposed in an m-row, n-column (m and n being integers) matrix form, on a rear surface of the semiconductor device, are formed. The rear surface electrodes for the differential input signals or differential output signals are disposed in rows, 1, 2, m−1, and m, or in columns, 1, 2, n−1, and n, of a matrix. Furthermore, a pair of rear surface electrodes for differential input signals that for a pair, and a pair of rear surface electrodes PAD for differential output signals that form a pair, are respectively disposed so as to be adjacent.

9 Claims, 9 Drawing Sheets

SEMICONDUCTOR DEVICE

BACKGROUND OF THE INVENTION

1. Field of the Invention

The present invention relates to a semiconductor device, and in particular, to a semiconductor device that handles differential signals.

2. Description of the Related Art

In various electronic devices, transmission of data using differential signals is being utilized for the purpose of reducing laid-out signal lines, or of increasing noise tolerance. For example, in laptop personal computers, folding mobile phones, or the like, a differential signal, known as a Low Voltage Differential Signal (referred to below as LVDS) or a Reduced Swing Differential Signal (referred to below as RSDS), is used for transmitting and receiving signals to and from a first casing in which operation buttons and the like are mounted, and a second casing in which a liquid crystal panel is mounted. Since high speed transmission and low power consumption are possible, the LVDS and the RSDS are distinguished by having excellent EMI (Electromagnetic Interference) characteristics, due to transmitting signals of small amplitude. For example, related technology is described in Patent Documents 1 and 2.

Patent Document 1: Japanese Patent Application Laid-Open No. H6-104936
Patent Document 2: Japanese Patent Application Laid-Open No. 2000-59443
Patent Document 3: Japanese Patent Application Laid-Open No. 2006-49695

In signal transmission using a differential signal, a digital value of 1 or 0 is converted into a signal pair having mutually reverse phases, to be transmitted. Here, if balance of electrical characteristics, such as length of signal path along which the signal pair is transmitted, or parasitic capacitance or parasitic resistance of the path, is lacking, problems occur in that symmetry of waveform of the signal pair is lost, transmission rate decreases, and the EMI deteriorates. The present inventors recognized a problem in that waveform of a differential signal deteriorates in cases in which a circuit for inputting and outputting the differential signal is configured as a Ball Grid Array (BGA) package, as described in Patent Document 3.

SUMMARY OF THE INVENTION

The present invention was realized in view of these issues, and a general purpose thereof is to provide a semiconductor device in which a differential signal can be preferably transmitted.

An embodiment of the present invention relates to a semiconductor device which receives a differential input signal, performs predetermined signal processing, and outputs a differential output signal. This semiconductor device is provided with a plurality of rear surface electrodes disposed in an m-row, n-column (m and n being integers) matrix form on a rear surface thereof. The rear surface electrodes for differential input signals or differential output signals are disposed in rows, 1, 2, m−1, and m, or in columns, 1, 2, n−1, and n. Rear surface electrodes for differential input signals that form a pair are disposed so as to be adjacent, and rear surface electrodes for differential output signals that form a pair are disposed so as to be adjacent.

According to this embodiment, a differential signal pair is inputted and outputted through rear surface electrodes disposed on an outermost track and on a track one inside the outermost track of the semiconductor device. Accordingly, when a wiring pattern is formed on a printed circuit board on which the semiconductor device is mounted, it is possible to conduct a pair of differential signals by an approximately equal wiring length, and preferable transmission of the differential signals can be realized.

In an embodiment, a rear surface electrode pair for the differential input signals that form a pair, and a rear surface electrode pair for the differential output signals that form a pair may be respectively disposed to be adjacent in a direction perpendicular to an outer side of the semiconductor device. Furthermore, the rear surface electrodes for the differential input signals that form a pair, and the rear surface electrodes for the differential output signals that form a pair may be disposed so that signals having the same polarity are adjacent.

The semiconductor device may have a rectangular form, with m≠n. By the semiconductor device having a rectangular form, and by the rear surface electrodes for input and output of the differential signals being disposed appropriately, it is possible to flexibly design the wiring pattern and form of the printed circuit board on which the semiconductor device is mounted.

A major portion of the rear surface electrodes for the differential input signals may be disposed along a short side of the rectangular form. In such cases, since wiring formed on the printed circuit board and connected to the rear surface electrodes for the differential input signals need not be drawn out in a direction perpendicular to a long side of the rectangular form, preferable usage is possible in a printed circuit board with an elongated shape. "A major portion" of the rear surface electrodes means that a part thereof may be disposed along another side, and the portion may be more than ½, and preferably more than ⅘, of the total number of differential input signals.

Furthermore, a major portion of the rear surface electrodes for the differential input signals may be disposed along a long side of the rectangular form.

An embodiment of the semiconductor device may have a ball grid array structure of a leadframe type. The semiconductor device may be provided with a semiconductor chip on which a circuit, which performs predetermined signal processing, is formed, and a substrate on which the semiconductor chip is mounted. The substrate may include a plurality of rear surface electrodes arranged in matrix form on a rear surface of a semiconductor chip-mounted surface, a plurality of lead electrodes connected through bonding wire to electrode pads arranged on the semiconductor chip, and via holes and wiring connecting the plurality of lead electrodes and the plurality of rear surface electrodes.

Among via holes by which differential input and differential output signals are transmitted, via holes, disposed on an inner track side of rear surface electrodes of a track that is one inside from the outermost track, may be connected to rear surface electrodes of rows 2 and m−1, or of columns 2 and n−1. The semiconductor device may be further provided with wiring used for connecting the rear surface electrodes and the via holes.

A semiconductor device in another embodiment may have a ball grid array structure of a wafer-level chip size package type. The semiconductor device may be further provided with a semiconductor chip on which a circuit, which performs predetermined signal processing, is formed, and a base on which the semiconductor chip is mounted. The substrate may include a plurality of rear surface electrodes arranged in matrix form on a rear surface of a semiconductor chip-mounted surface, and a post and rewiring that connect electrode pads arranged on the semiconductor chip to the plurality of rear surface electrodes.

The semiconductor device may include a timing control circuit for driving a liquid crystal panel. After a luminance signal and a clock signal for each color are respectively inputted as differential signals, and predetermined signal processing is carried out, a drive signal for an external liquid crystal driver may be outputted as a differential signal.

Another embodiment of the present invention is an electronic device. The electronic device is provided with a liquid crystal panel, the abovementioned semiconductor device, a driver circuit which receives a differential signal from a timing control circuit included in the semiconductor device and drives the liquid crystal panel, and a multilayer printed circuit board on which at least the semiconductor device is mounted. A differential input signal or a differential output signal, inputted to the semiconductor device, or outputted from the semiconductor device is transmitted through a pattern formed on a surface layer of the board.

According to this embodiment, since the differential signal is transmitted on the surface layer of the printed circuit board but is not transmitted by via holes or the like, it is possible to reduce parasitic capacitance or parasitic resistance of the signal path, and good transmission of a differential signal can be realized.

The present electronic device may be a computer in which a first casing, on which a keyboard is mounted, and a second casing, on which a liquid crystal panel is mounted, are foldably connected, and the multilayer printed circuit board may be disposed between the first casing and the liquid crystal panel, inside the second casing.

In such cases, since the multilayer printed circuit board is not disposed on a rear surface of the liquid crystal panel, it is possible to make the second casing thin.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
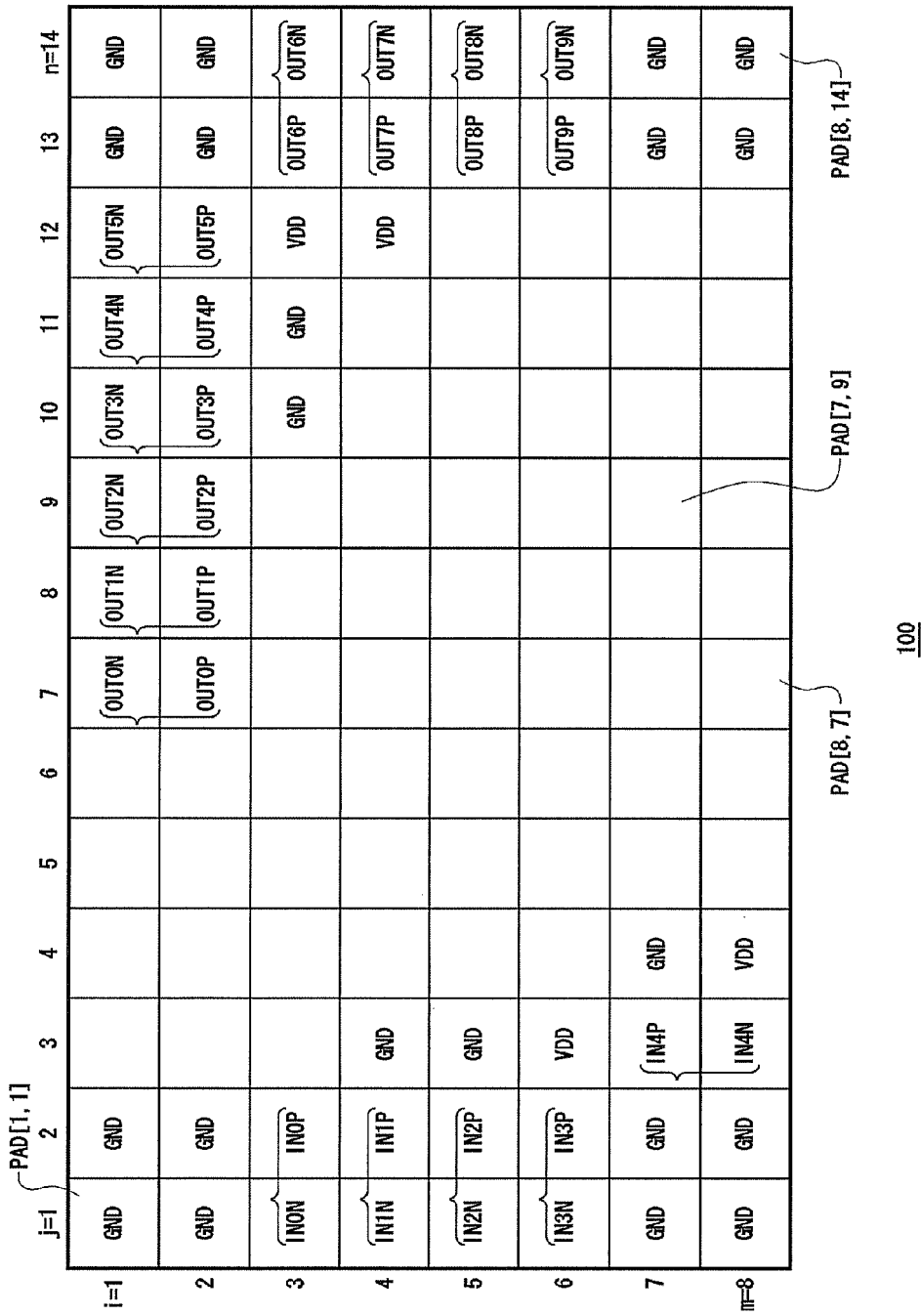
FIG. 1 is a plan view showing a rear surface on which electrodes of a semiconductor device according to an embodiment are formed.

FIG. 1 is a plan view, seen through a front surface, of a rear surface on which electrodes of a semiconductor device 100 according to an embodiment are formed. The semiconductor device 100 receives differential input signals IN, performs predetermined signal processing, and outputs differential output signals OUT.

The semiconductor device 100 is provided with a plurality of rear surface electrodes PAD disposed in an m-row, n-column (m and n being integers) matrix form on a rear surface thereof. Below, a rear surface electrode of row i, column j, is written as PAD(i, j). In the present embodiment, the semiconductor device 100 has a rectangular form, m≠n, m=8, and n=14. Preferably, the semiconductor device 100 is a so-called BGA (Ball Grid Array) package, and the rear surface electrodes PAD are ball (bump) electrodes. A signal, a power supply voltage, or a ground voltage inputted to the semiconductor device 100 or outputted from the semiconductor device 100 is inputted or outputted through the rear surface electrodes PAD. The rear surface electrodes PAD are circular in reality, but are shown as simplified square shapes in FIG. 1, and a transmitted signal is shown inside each square shape.

The semiconductor device 100 receives a plurality (five) of differential input signals IN0 to IN4, carries out predetermined signal processing, and outputs a plurality (ten) of differential output signals OUT0 to OUT9. The numbers of differential signals are by way of example, and these numbers are arbitrary. Each differential signal is configured to include a complementary signal pair, of mutually reverse phases, distinguished by accompanying letters P and N. For example, a k-th (k being an integer) differential input signal INk includes INkP and INkN, and a k-th differential output signal OUTk includes OUTkP and OUTkN.

In the present embodiment, the rear surface electrodes PAD for the differential input signals IN0 to IN4, or the differential output signals OUT0 to OUT9, are disposed in matrix rows 1, 2, m−1, and m, that is, in rows 1, 2, 7, and 8; or are disposed in matrix columns 1, 2, n−1, and n, that is, columns 1, 2, 13, and 14. Seen from another viewpoint, the rear surface electrodes PAD for the differential signals are disposed in an outermost track and in a track that is one inside the outermost track of the semiconductor device 100.

Furthermore, a pair of rear surface electrodes PAD for the differential input signals that form a pair INkP and INkN is disposed so that the electrodes are adjacent. In a similar way, a pair of rear surface electrodes PAD for the differential output signals that form a pair OUTkP and OUTkN is disposed so that the electrodes are adjacent.

In FIG. 1, the pair of rear surface electrodes PAD for the differential input signals that form a pair INk, and the pair of rear surface electrodes PAD for the differential output signals that form a pair OUTk are respectively disposed to be adjacent in a direction perpendicular to an outer side of the semiconductor device 100. For example, differential input signals INkP and INkN (k=0 to 3) that form pairs are disposed such that signals of each pair are adjacent in a direction perpendicular to a left-hand side of the semiconductor device 100 in FIG. 1, and differential input signals INkP and INkN (k=4)

that form a pair are disposed such that signals of the pair are adjacent in a direction perpendicular to a bottom side of the semiconductor device 100 in FIG. 1. Furthermore, differential output signals OUTkP and OUTkN (k=0 to 5) that form pairs are disposed such that signals of each pair are adjacent in a direction perpendicular to a top side of the semiconductor device 100 in FIG. 1, and differential output signals OUTkP and OUTkN (j=6 to 9) that form pairs are disposed such that signals of each pair are adjacent in a direction perpendicular to a right-hand side of the semiconductor device 100 in FIG. 1.

Furthermore, among the differential signals forming pairs, signals having a first polarity (N in FIG. 1) are disposed on an outer side, and signals having a second polarity (P in FIG. 1) are disposed on an inner side. That is, signals having the same polarity are disposed so as to be adjacent. In other words, signals of different polarity are respectively inputted or outputted to the rear surface electrodes PAD of the outermost track, and the rear surface electrodes PAD of a track inside thereof. Polarity of N and P may be opposite.

Furthermore, a large portion of the rear surface electrodes PAD for the differential input signals are disposed along a short side (left-hand side) of the rectangular form. Namely, four of the differential input signals among the five differential input signals, that is, 4/5 of the differential input signals, are disposed along the short side.

In the semiconductor device 100 of FIG. 1, the rear surface electrodes PAD (i, j), of four corners of the matrix (here, i=1, 2, m−1, and m; and j=1, 2, n−1, and n) are for grounding. In this way, a stable ground potential can be supplied to the semiconductor chip inside the semiconductor device 100. Other rear surface electrodes PAD of FIG. 2 are used for grounding or for a power supply voltage VDD.

Figure 2:
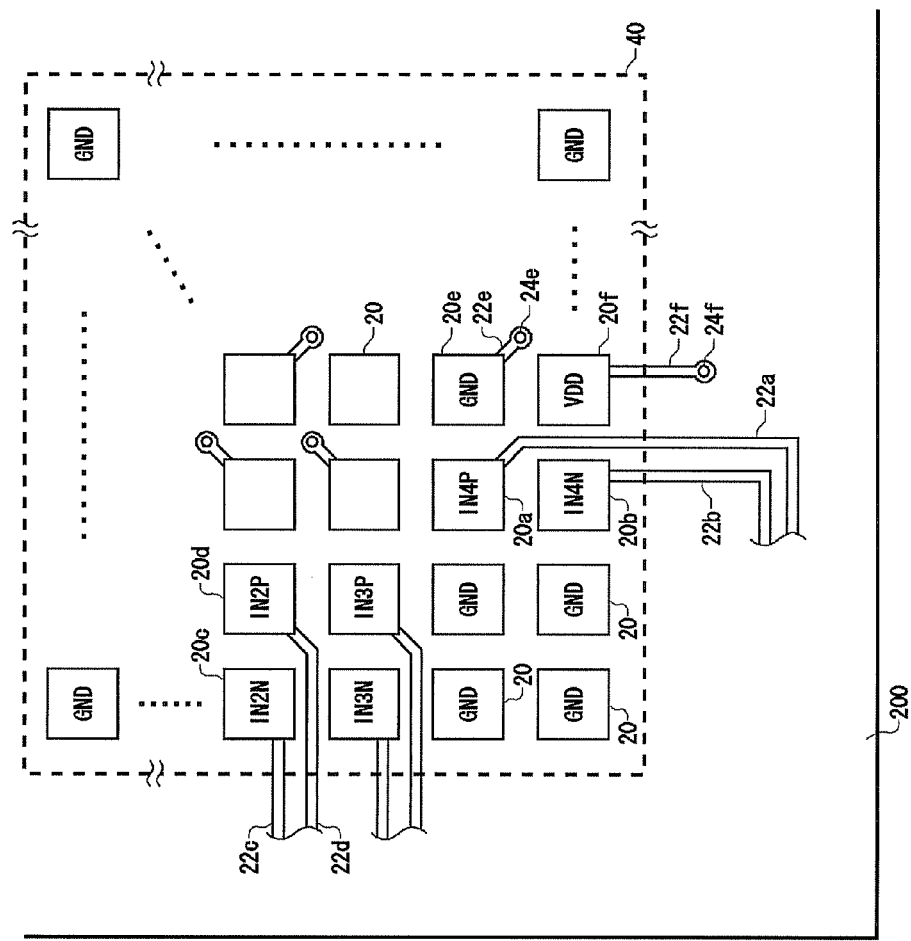
FIG. 2 shows a portion of a surface layer of a printed circuit board on which the semiconductor device of FIG. 1 is mounted.

FIG. 2 shows a portion of a surface layer of a printed circuit board 200 on which the semiconductor device 100 of FIG. 1 is mounted. The printed circuit board 200 has a multilayer structure, and the printed circuit board 200 is electrically and mechanically connected by solder to a surface layer of the semiconductor device 100. Lands 20 connected to rear surface electrodes PAD of the semiconductor device 100, and pattern wiring 22 for conducting a signal from the lands 20, are formed on the printed circuit board 200. The lands 20 are disposed in matrix form corresponding to the rear surface electrodes PAD. Furthermore, a broken line 40 in FIG. 2 indicates a mounting position of the semiconductor device 100.

For example, the lands 20a and 20b are respectively connected to the rear surface electrodes PAD (7, 3) and PAD (8, 3) for the differential input signals IN4P and IN4N of FIG. 1. As another example, the lands 20c and 20d are respectively connected to the rear surface electrodes PAD (5, 1) and PAD (5, 2) for the differential input signals IN2N and IN2P of FIG. 1.

In the present embodiment, differential input signals or differential output signals, inputted to the semiconductor device 100 or outputted from the semiconductor device 100, are conducted to other blocks, through the pattern wiring 22 formed on the surface layer of the printed circuit board 200. In FIG. 2, the pattern wiring 22a and 22b forms wiring respectively drawn out from the lands 20a and 20b. In a similar way, the pattern wiring 22c and 22d forms wiring respectively drawn out from the lands 20c and 20d. The pattern wiring 22a to 22d for transmitting differential signals is laid out on the surface layer of the printed circuit board 200. The pattern wiring 22a to 22d does not migrate to another wiring layer, and conducts signals from the surface layer of the printed circuit board 200 to another circuit block.

With regard to pattern wiring in which differential signals are not transmitted, signals are conducted through pattern wiring formed on the surface layer of the printed circuit board 200, or pattern wiring formed on another layer not shown in the figures. For example, the lands 20e and 20f are, respectively, lands for grounding and for power supply, but ground potential GND or power supply voltage VDD is supplied from another wiring layer through the pattern wiring 22e and 22f and the via holes 24e and 24f connected to the lands 20e and 20f.

According to the semiconductor device 100 according to the present embodiment, the rear surface electrodes PAD for the differential signals are disposed on an outer track of a matrix. As a result, in the printed circuit board 200 on which the semiconductor device 100 is mounted, it is possible to form the pattern wiring in which the differential signals are transmitted, on only the surface layer. If the rear surface electrodes PAD for the differential signals are disposed in a region indicated by $3 \leq i \leq m-2$ and $3 \leq j \leq n-2$, inside the matrix, limitations due to a pattern wiring rule occur, and it becomes difficult to conduct a signal from the lands 20 connected to the rear surface electrodes thereof, through only the surface layer of the printed circuit board 200, to a desired location. If another wiring layer through a via hole is used, unexpected or unnecessary parasitic capacitance, parasitic resistance, or the like, affects waveform of the differential signals. Particularly in recent years, there has been progress in narrowing of pitch of ball grid arrays, and it is becoming increasingly difficult to conduct a signal to a desired location on a circuit, using only a wiring pattern of the surface layer from the lands of an inner track.

In comparison to that, in the semiconductor device 100 according to the present embodiment, since it is possible to conduct the differential signals to a desired position by the wiring pattern of the surface layer, it is possible to inhibit distortion of signal waveform and to preferably transmit the differential signals.

Furthermore, by assigning the differential signals that form pairs to adjacent rear surface electrodes PAD, it is possible to make equal the length of wiring of a differential pair, and it is possible to improve symmetry of the differential signals.

Figure 3:
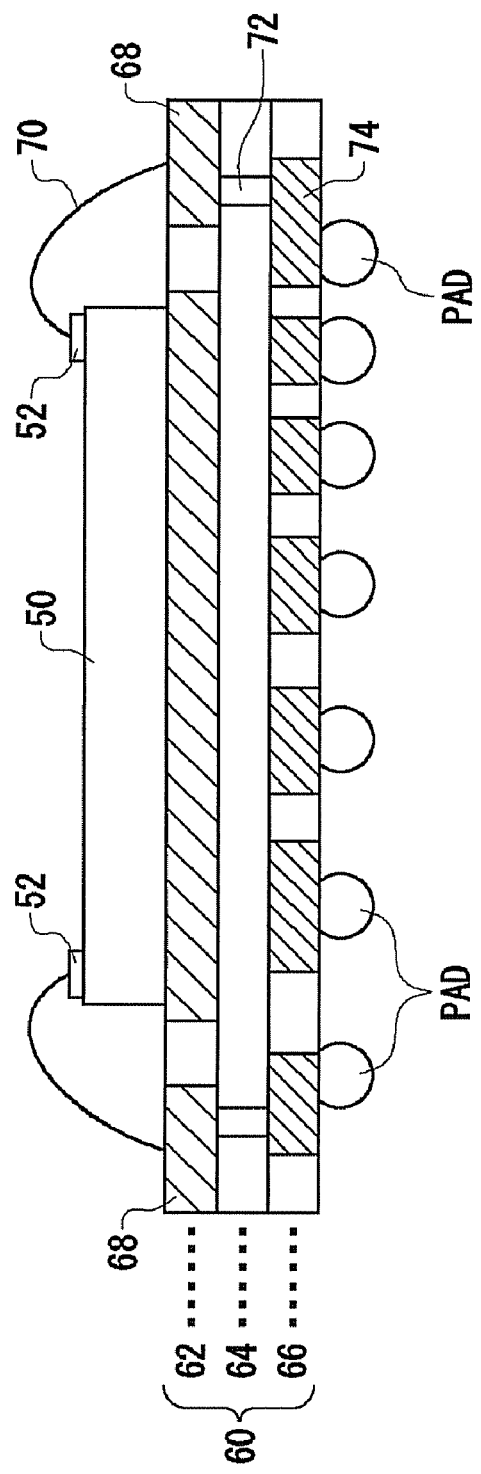
FIG. 3 shows a lateral cross-sectional view of the semiconductor device of FIG. 1.
Figure 4A:
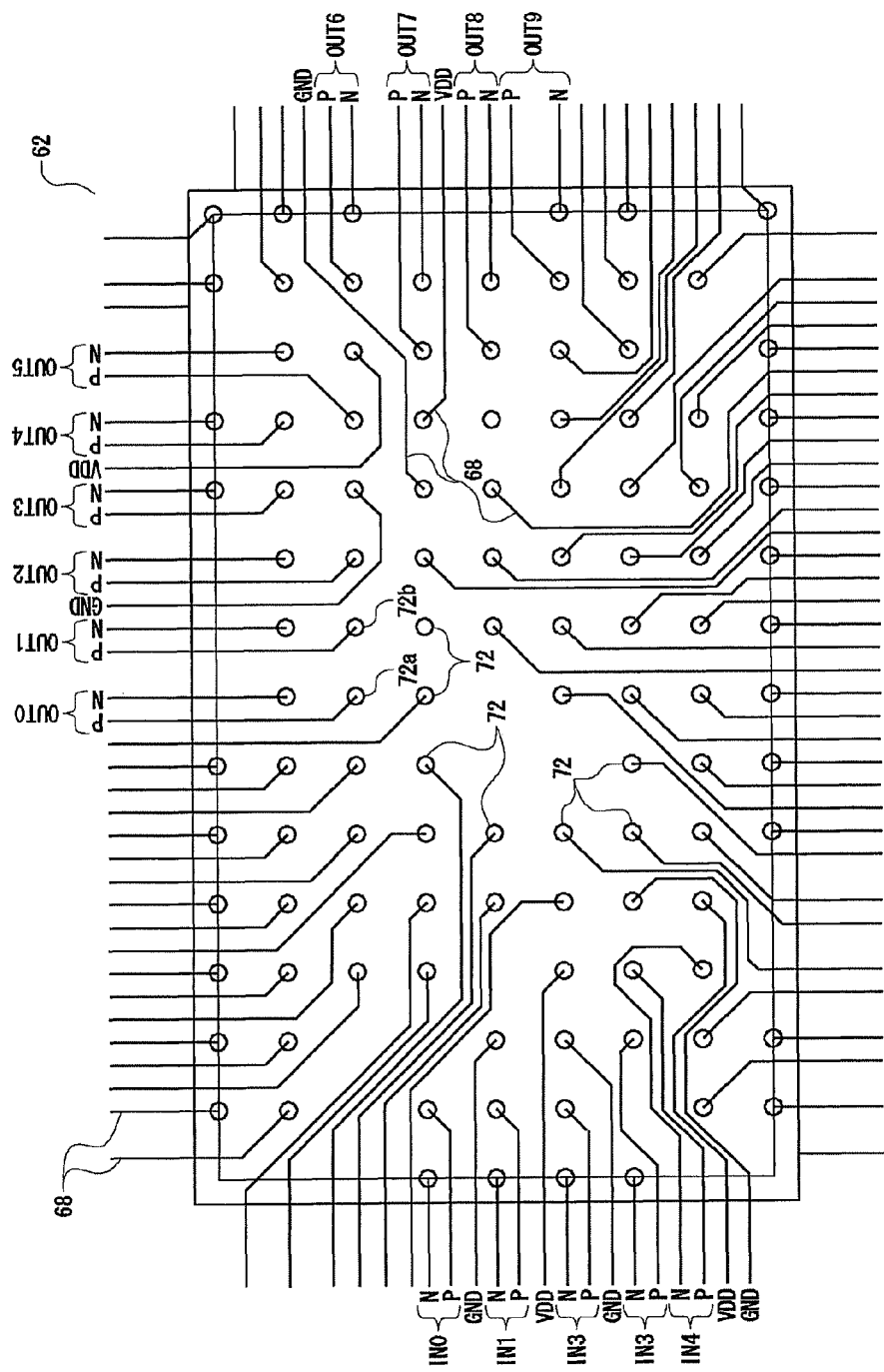
FIG. 4A is a plan view of a leadframe layer of the semiconductor device 100 of FIG. 3.
Figure 4B:
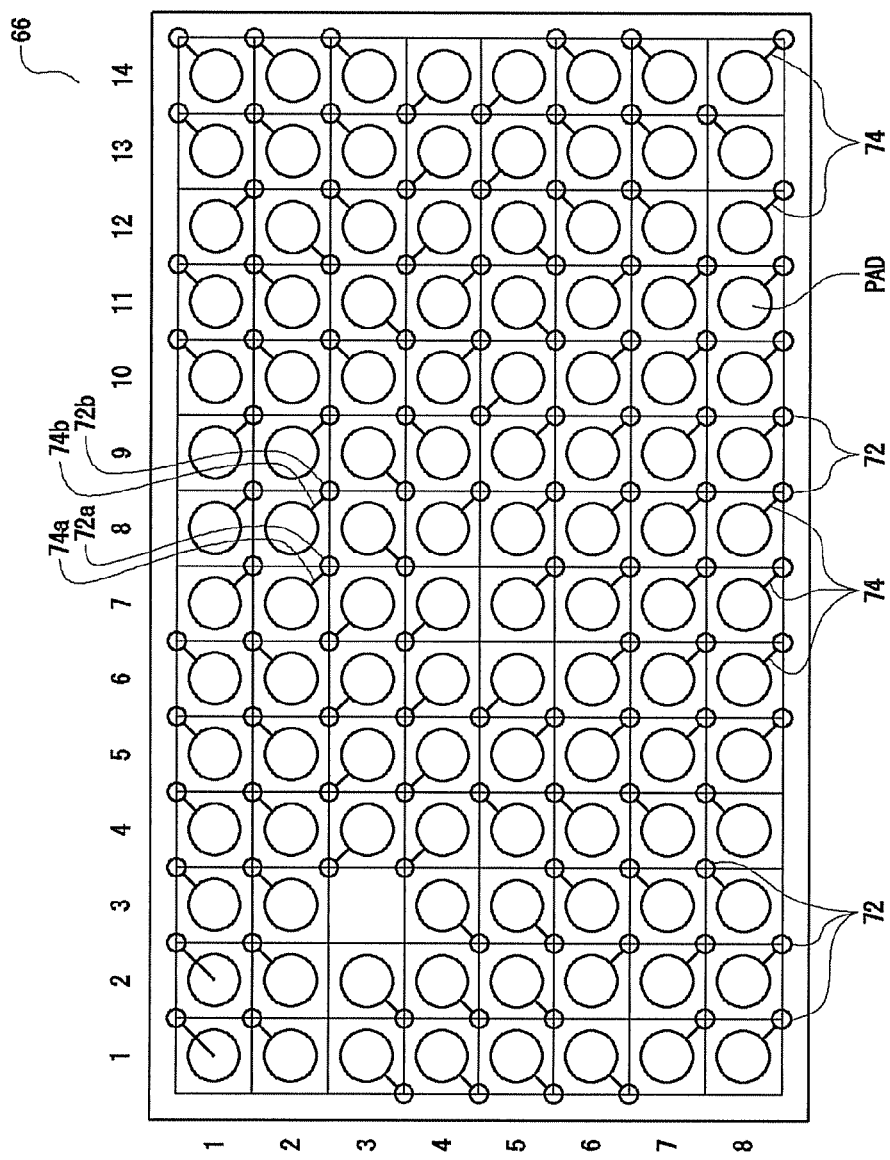
FIG. 4B is a plan view of a wiring layer of the semiconductor device 100 of FIG. 3.

Next, an explanation will be given concerning a specific internal configuration of the semiconductor device 100. FIG. 3 shows a lateral cross-sectional view of the semiconductor device 100 of FIG. 1. FIGS. 4A and 4B are plan views of the semiconductor device 100 of FIG. 3, and respectively show a leadframe 62 and a wiring layer 66.

The semiconductor device 100 has a BGA package structure of a so-called leadframe type. As shown in FIG. 3, the semiconductor device 100 is provided with a semiconductor chip 50 and a substrate 60. A circuit for executing predetermined signal processing is formed on the semiconductor chip 50. Electrode pads 52 for inputting and outputting signals along an outer track are arranged on a surface layer of the semiconductor chip 50.

The substrate 60 has a multilayer structure, and includes the leadframe layer 62, an insulating layer 64, and the wiring layer 66. A top surface (upper face) of the substrate 60 forms a mounting surface for the semiconductor chip 50, and the rear surface electrodes PAD of FIG. 1 are formed in matrix form on a rear surface thereof (bottom face). A leadframe 68 is formed on the leadframe layer 62. One edge of the leadframe 68 is connected through a bonding wire 70 to the electrode pad 52 of the semiconductor chip 50.

The other edge of the leadframe 68 is drawn as far as a vicinity of a predetermined rear surface electrode PAD position. A via hole 72 is arranged in the insulating layer 64 and connects the other edge of the leadframe 68 and the rear surface electrodes PAD connected to the wiring 74 formed on the wiring layer 66. Via holes 72 are disposed at four corners of the plural rear surface electrodes PAD.

As shown in FIG. 4B, among the via holds 72 through which the differential input signals IN and the differential output signals OUT are transmitted, the via holes 72 disposed on an inner track side of rear surface electrodes PAD of a track that is one inside the outermost track, are connected to rear surface electrodes of rows 2 and m−1, or columns 2 and n−1. For example, the differential output signals OUT0P and OUT1P are conducted to the wiring layer 66 through the via holes 72*a* and 72*b*, respectively connecting with rear surface electrodes PAD (2, 7) and (2, 8) of row 2, through wiring 74*a* and 74*b* in the wiring layer 66.

Furthermore, the semiconductor device 100 may be configured, not from a leadframe type of BGA as shown in FIG. 3 and FIGS. 4A and 4B, but from a wafer-level chip size package (WL-CSP) type of BGA. In such cases, the leadframe 68 is formed as rewiring, and the via holes 72 are formed as posts.

Next, an explanation will be given concerning application of the abovementioned semiconductor device 100. The semiconductor device 100 of FIG. 1 may preferably be used, for example, in a timing control circuit for driving a liquid crystal display of a laptop personal computer.

FIG. 5A to 5D are block diagrams showing configurations of a laptop personal computer 300. The personal computer 300 is provided with a first casing 310 in which a keyboard, a CPU, a hard disk device (not shown in the figures), and the like are installed, and a second casing 320 in which a liquid crystal panel 322 is installed. The first casing 310 and the second casing 320 are connected by a hinge structure, to enable folding.

Figure 5A:
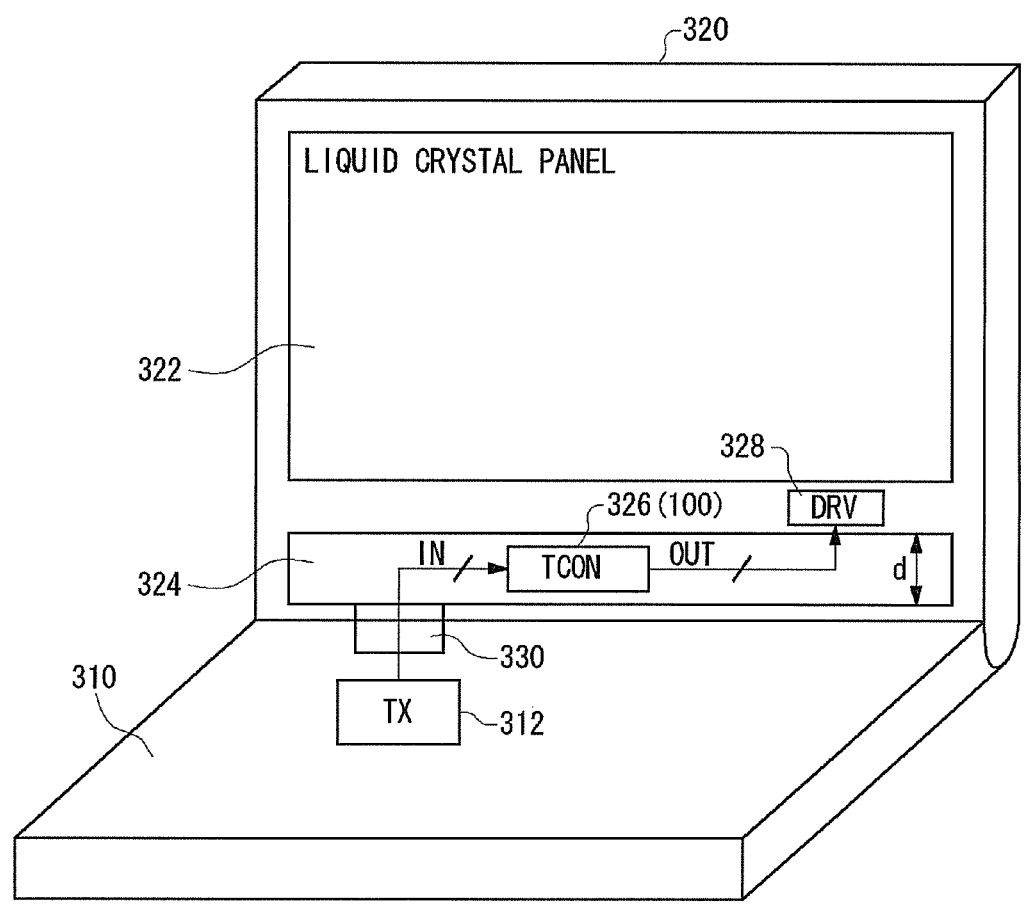
FIG. 5A is a block diagram showing a configuration example of a laptop personal computer.

Image data to be displayed on the liquid crystal panel 322 is transmitted through a flexible cable 330 from the first casing 310 to the second casing 320. An LVDS transmission circuit 312 installed in the first casing 310 performs parallel-serial conversion of the image data, and transmits a luminance signal and a clock signal for each color, as respective differential signals, to the second casing 320. Furthermore, FIG. 5B to 5D only differ in member layout, compared to FIG. 5A, and some members that are common to FIG. 5A are omitted.

After the differential signals outputted from the LVDS transmission circuit 312 are inputted to the timing control circuit 326 and predetermined signal processing is carried out, a drive signal is outputted as a differential signal to an external liquid crystal driver 328. RSDS transmission is used for output of the differential signals. The liquid crystal driver 328 receives the differential signals from the timing control circuit 326, and drives the liquid crystal panel 322.

Figure 5B:
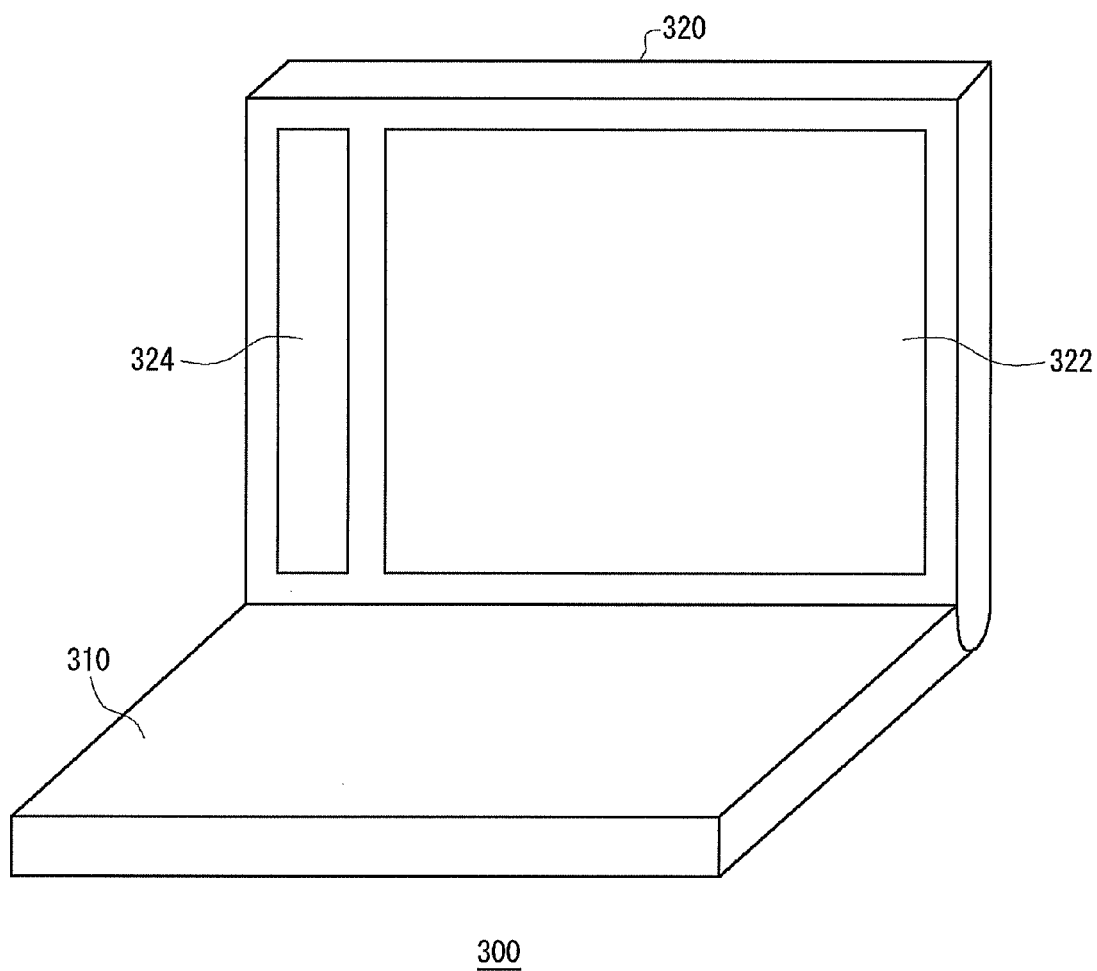
FIG. 5B is a block diagram showing a configuration example of a laptop personal computer.
Figure 5C:
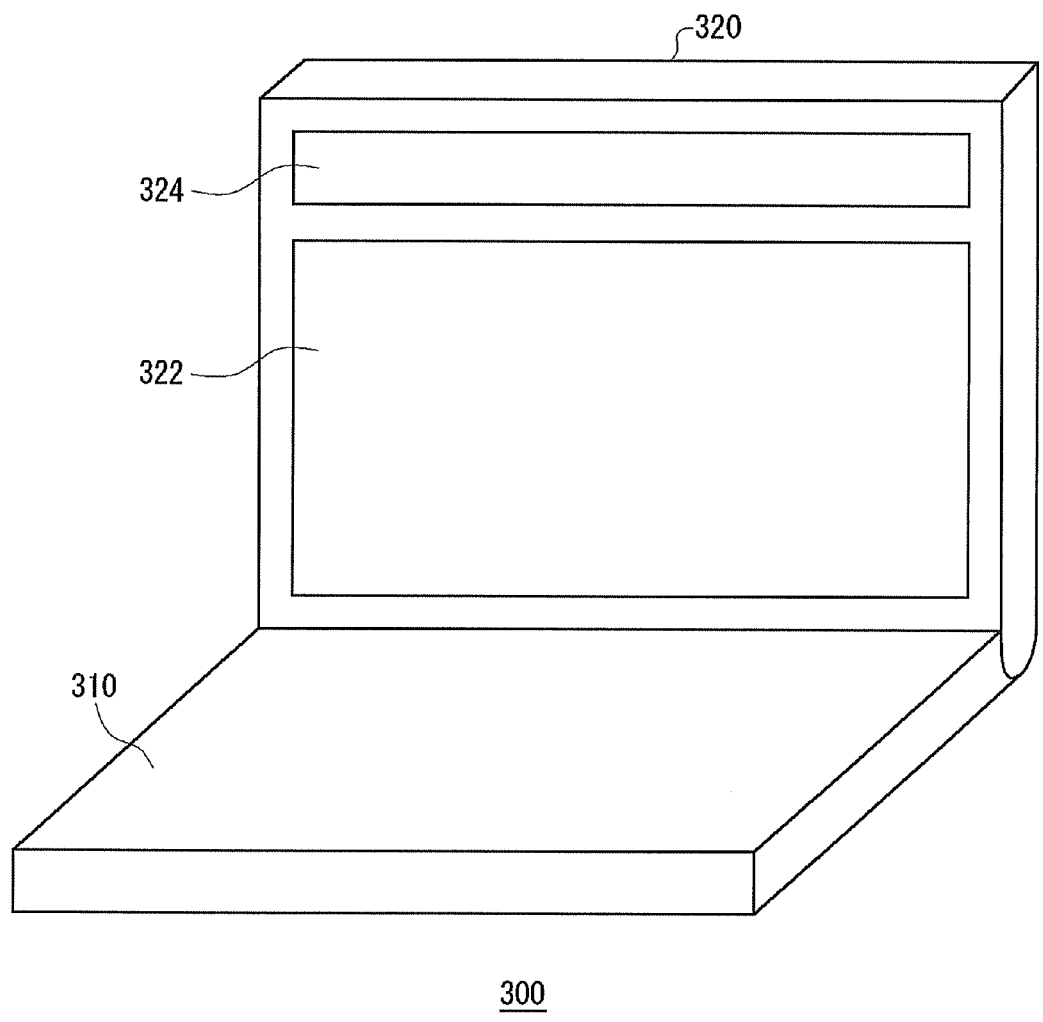
FIG. 5C is a block diagram showing a configuration example of a laptop personal computer.

The timing control circuit 326 is mounted on a multilayer printed circuit board 324. In FIGS. 5A to 5C, the multilayer printed circuit board 324 is disposed, not on a rear surface of the liquid crystal panel 322, inside the second casing 320, but at a position adjacent to any side of the liquid crystal panel 322. The multilayer printed circuit board 324 corresponds to the printed circuit board 200 of FIG. 2. Accordingly, a differential signal inputted to the timing control circuit 326, which is the semiconductor device 100, or outputted from the timing control circuit 326, is transmitted through pattern wiring formed on a surface layer of the multilayer printed circuit board 324, and this is possible by having pads for input and output of the differential signals of the timing control circuit 326 as the rear surface electrodes PAD of the outermost track and one track inside thereof. As a result, since it is possible to conduct a signal pair of a differential signal by wiring of approximately the same length, preferable signal transmission can be realized.

Furthermore, by forming the timing control circuit 326 in a rectangular shape as in FIG. 1, the multilayer printed circuit board 324, on which the timing control circuit 326 is mounted, can have an elongated form. With the elongated multilayer printed circuit board 324, since it can be mounted, not on the rear surface of liquid crystal panel 322 as shown in FIGS. 5A to 5C, but at a position adjacent to the liquid crystal panel 322, it is possible to make the second casing 320 thin.

Furthermore, as shown in FIG. 1, by disposing the rear surface electrodes PAD for differential input signals to the left-side of the semiconductor device 100, and disposing the rear surface electrodes PAD for differential output signals to the right-side of the semiconductor device 100, a signal can be preferably configured from the LVDS transmission circuit 312 to the liquid crystal driver 328. Furthermore, by disposing the rear surface electrodes PAD for differential input signals in a concentrated form at a short side of the semiconductor device 100, it is possible to draw out a wiring pattern on the multilayer printed circuit board 324 in a longitudinal direction of the multilayer printed circuit board 324. As a result, it is possible to shorten a width d of the multilayer printed circuit board 324, and mounting to a narrow and small space becomes easy.

Furthermore, in cases in which a plurality of liquid crystal drivers 328 are arranged along any side of the liquid crystal panel 322 of FIGS. 5A to 5C, the rear surface electrodes PAD for differential output signals may be disposed at a long side of the semiconductor device 100. In this way, it becomes easy to supply a signal to the plurality of liquid crystal drivers 328.

Figure 5D:
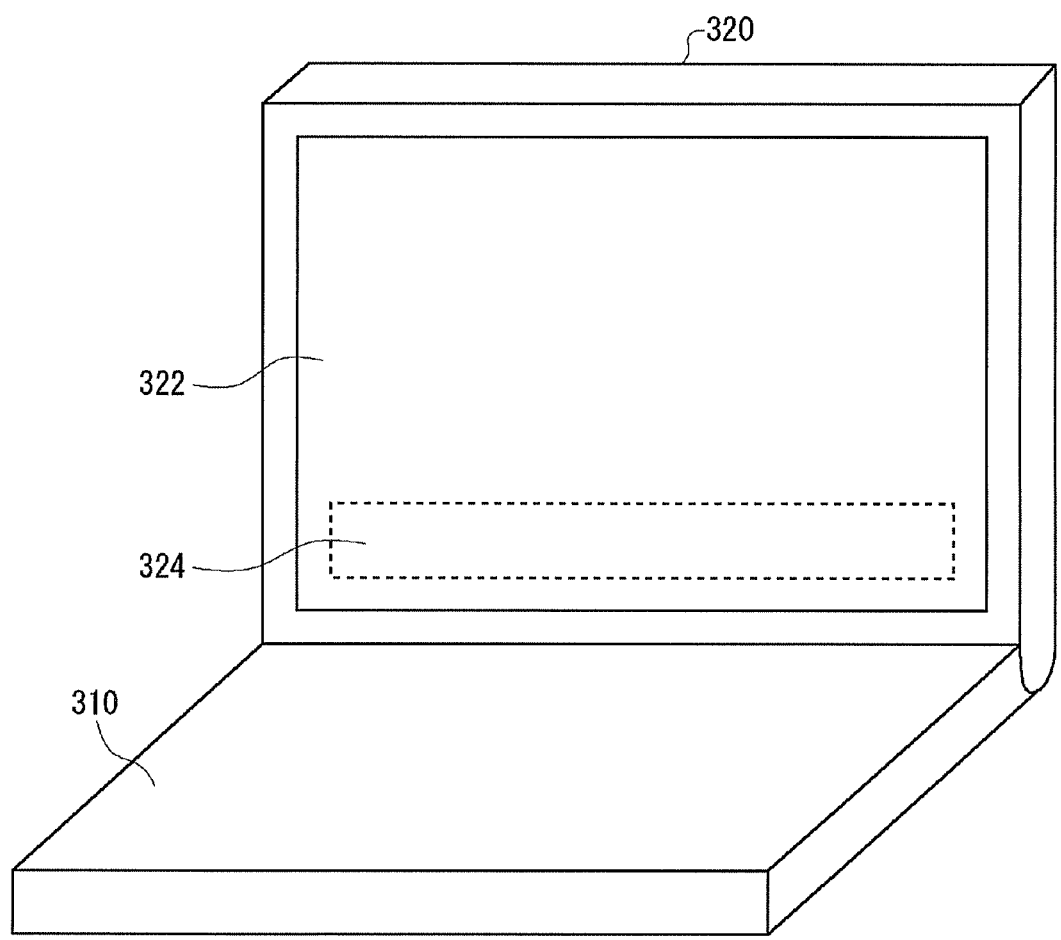
FIG. 5D is a block diagram showing a configuration example of a laptop personal computer.

Furthermore, as shown in FIG. 5D, the multilayer printed circuit board 324, on which the timing control circuit 326 is mounted, may be disposed on a rear surface of the liquid crystal panel 322. In such cases, instead of making the second casing 320 thin, it is possible to make the area of the second casing 320 small.

The present invention has been explained based on the embodiment; however, the embodiment merely shows principles and applications of the invention, and many modified examples and changes to arrangements are possible within a scope that does not depart from the spirit of the invention as prescribed in the scope of the claims.

In the embodiment, an explanation has been given concerning cases in which the semiconductor device 100 has a rectangular form, but this may also have a square form.

Furthermore, the timing control circuit 326 used in a laptop personal computer is exemplified as an application of the semiconductor device 100, but the present invention is not limited thereto, and usage is possible in many circuits for inputting and outputting differential signals.

While the preferred embodiments of the present invention have been described using specific terms, such description is for illustrative purposes only, and it is to be understood that changes and variations may be made without departing from the spirit or scope of the appended claims.

What is claimed is:

1. A semiconductor device which receives differential input signals, performs predetermined signal processing, and outputs differential output signals, the semiconductor device comprising:
   a timing control circuit which drives a liquid crystal panel which, after a luminance signal and a clock signal according to color are respectively inputted as the differential input signals, and the predetermined signal processing is carried out, outputs a drive signal to an external liquid crystal driver as a differential output signal; and a plurality of rear surface electrodes disposed in an m-row, n-column matrix form on a rear surface of the semiconductor device, m and n being integers greater than or equal to 4; wherein the rear surface electrodes for the differential input signals and the differential output signals are disposed in rows, 1, 2, m−1, and m, or in columns, 1, 2, n−1, and n;

and rear surface electrodes for the differential input signals that form a pair are disposed so as to be adjacent, and the rear surface electrodes for the differential output signals that form a pair are disposed so as to be adjacent, and wherein the semiconductor device has a ball grid array structure of a leadframe type, and further comprises:

a semiconductor chip on which a circuit, which performs the predetermined signal processing, is formed; and a substrate on which the semiconductor chip is mounted;

and wherein the substrate includes:

the plurality of rear surface electrodes arranged in matrix form on a rear surface of a surface on which the semiconductor chip is mounted;

a plurality of lead electrodes connected through bonding wire to electrode pads arranged on the semiconductor chip; and via holes and wiring connecting the plurality of lead electrodes and the plurality of rear surface electrodes, and wherein, among the via holes by which the differential input signals and differential output signals are transmitted, via holes, disposed on an inner track side of rear surface electrodes of a track that is one track inside from an outermost track, are connected to rear surface electrodes of row 2 and row m−1, or of column 2 and column n−1 column.

2. A semiconductor device according to claim 1, wherein the rear surface electrodes for the differential input signals that form a pair, and the rear surface electrodes for the differential output signals that form a pair are respectively disposed so as to be adjacent in a direction perpendicular to an outer side of the semiconductor device.

3. A semiconductor device according to claim 2, wherein the rear surface electrodes for the differential input signals that form a pair, and the rear surface electrodes for the differential output signals that form a pair are disposed so that signals having an identical polarity are adjacent.

4. A semiconductor device according to claim 1, wherein the semiconductor device has a rectangular form, with m≠n.

5. A semiconductor device according to claim 4, wherein a major portion of the rear surface electrodes for the differential input signals is disposed along a short side of the rectangular form.

6. A semiconductor device according to claim 4, wherein a major portion of the rear surface electrodes for the differential input signals is disposed along a long side of the rectangular form.

7. A semiconductor device according to claim 1, wherein the semiconductor device has a ball grid array structure of a wafer-level chip size package type, and further comprises:

a semiconductor chip on which a circuit, which performs the predetermined signal processing, is formed; and a substrate on which the semiconductor chip is mounted;

and wherein the substrate includes:

the plurality of rear surface electrodes arranged in matrix form on a rear surface of a surface on which the semiconductor chip is mounted; and a post and rewiring, connecting electrode pads arranged on the semiconductor chip to the plurality of rear surface electrodes.

8. An electronic device comprising:

a liquid crystal panel;

the semiconductor device according to claim 1;

a driver circuit which receives a differential signal from a timing control circuit included in the semiconductor device and drives the liquid crystal panel; and a multilayer printed circuit board on which the semiconductor device is mounted; wherein the differential input signals and the differential output signals, inputted to the semiconductor device and outputted from the semiconductor device are transmitted through a pattern formed on a surface layer of the board.

9. An electronic device according to claim 8, wherein the electronic device is a computer in which a first casing, on which a keyboard is mounted, and a second casing, on which the liquid crystal panel is mounted, are foldably connected; and the multilayer printed circuit board is disposed between the first casing and the liquid crystal panel, inside the second casing.

* * * * *